United States Patent
Graff et al.

(10) Patent No.: US 10,041,818 B2
(45) Date of Patent: Aug. 7, 2018

(54) WIRELESS TEMPERATURE AND/OR HUMIDITY SENSOR ASSEMBLY

(71) Applicant: Therm-O-Disc, Incorporated, Mansfield, OH (US)

(72) Inventors: Timothy Graff, Mansfield, OH (US); Gary D. Dinges, Mansfield, OH (US); David Connell, Galion, OH (US)

(73) Assignee: Thermo-O-Disc, Incorporated, Mansfield, OH (US)

( * ) Notice: Subject to any disclaimer, the term of this patent is extended or adjusted under 35 U.S.C. 154(b) by 0 days.

(21) Appl. No.: 14/909,275

(22) PCT Filed: Oct. 24, 2013

(86) PCT No.: PCT/US2013/066657
§ 371 (c)(1),
(2) Date: Feb. 5, 2016

(87) PCT Pub. No.: WO2015/020680
PCT Pub. Date: Feb. 12, 2015

(65) Prior Publication Data
US 2016/0169713 A1    Jun. 16, 2016

Related U.S. Application Data

(60) Provisional application No. 61/864,080, filed on Aug. 9, 2013.

(51) Int. Cl.
*G01D 11/24* (2006.01)
*F24F 11/30* (2018.01)
(Continued)

(52) U.S. Cl.
CPC ............ *G01D 11/245* (2013.01); *F24F 11/30* (2018.01); *G01K 1/024* (2013.01); *G01K 1/08* (2013.01);
(Continued)

(58) Field of Classification Search
CPC ..................................................... G01D 11/24
(Continued)

(56) References Cited

U.S. PATENT DOCUMENTS

| | | | |
|---|---|---|---|
| 4,529,933 A * | 7/1985 | Bleeke | G01P 3/488 310/168 |
| 5,875,413 A | 2/1999 | Vinci | |

(Continued)

FOREIGN PATENT DOCUMENTS

| | | |
|---|---|---|
| JP | 2003073876 | 3/2003 |
| JP | 2006208000 | 8/2006 |

(Continued)

OTHER PUBLICATIONS

International Search Report and Written Opinion of the ISA for PCT/US2013/066657, ISA/US, dated Mar. 20, 2014.

*Primary Examiner* — Harshad R Patel
*Assistant Examiner* — Jamel Williams
(74) *Attorney, Agent, or Firm* — Harness, Dickey & Pierce, P.L.C.

(57) ABSTRACT

A wireless sensor assembly for monitoring conditions in an ambient environment, such as for use in a climate control system for a data center is disclosed. The sensor assembly has a small form-factor housing extending along a longitudinal axis and defining an interior space. A sensor circuit is disposed within the housing and includes at least one sensor element for detecting temperature and/or humidity that is enclosed within a vented sub-chamber of the housing. A mounting member forming part of an exterior surface of the housing mounts the sensor assembly vertically along the at an installation location within an ambient environment being monitored.

13 Claims, 9 Drawing Sheets

(51) Int. Cl.
| | |
|---|---|
| *G01L 1/08* | (2006.01) |
| *G01K 1/02* | (2006.01) |
| *G01K 1/14* | (2006.01) |
| *H04Q 9/00* | (2006.01) |
| *H05K 7/20* | (2006.01) |
| *G01K 1/08* | (2006.01) |
| *F24F 110/10* | (2018.01) |
| *F24F 110/20* | (2018.01) |
| *F24F 11/56* | (2018.01) |

(52) U.S. Cl.
CPC ................ *G01K 1/14* (2013.01); *H04Q 9/00* (2013.01); *H05K 7/20836* (2013.01); *F24F 11/56* (2018.01); *F24F 2110/10* (2018.01); *F24F 2110/20* (2018.01); *H04Q 2209/43* (2013.01)

(58) Field of Classification Search
USPC .......................................................... 73/431
See application file for complete search history.

(56) References Cited

U.S. PATENT DOCUMENTS

| | | | |
|---|---|---|---|
| 2006/0158327 A1* | 7/2006 | Fuchs | G08B 17/10 340/531 |
| 2010/0290183 A1* | 11/2010 | Rijken | G01K 1/20 361/679.48 |
| 2011/0215946 A1* | 9/2011 | Aguren | G08C 19/00 340/870.3 |
| 2013/0145844 A1* | 6/2013 | Hauschel | G01D 11/245 73/431 |

FOREIGN PATENT DOCUMENTS

| | | | | |
|---|---|---|---|---|
| JP | 2007-120657 A | | 5/2007 | |
| JP | 2007120657 A | * | 5/2007 | |
| JP | 2010014321 | | 1/2010 | |
| JP | 2011511455 | | 4/2011 | |
| JP | 2013057452 | | 2/2013 | |
| WO | WO-2009/139765 A1 | | 11/2009 | |
| WO | WO 2009139765 A1 | * | 11/2009 | ............ G01D 11/24 |

\* cited by examiner

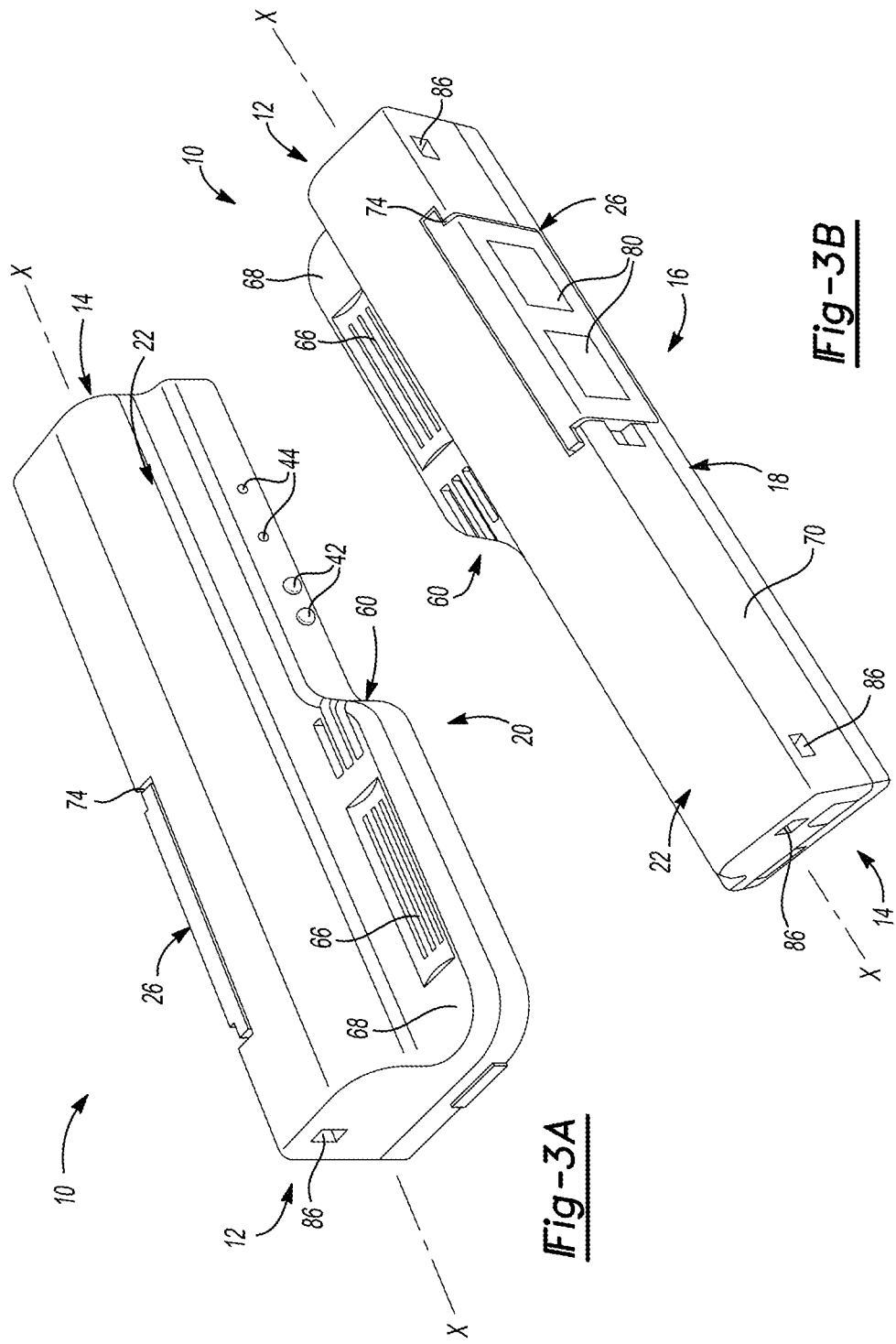

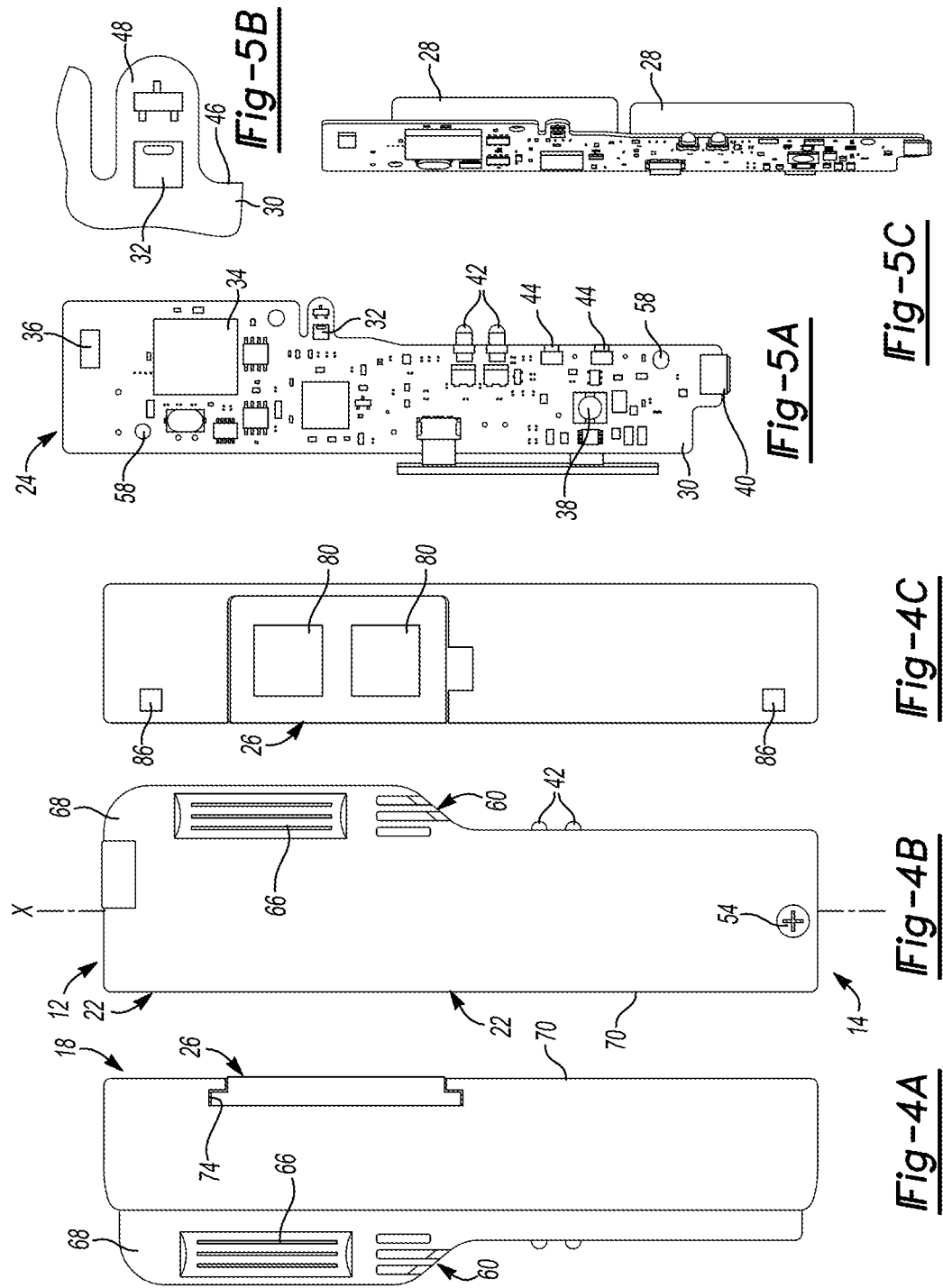

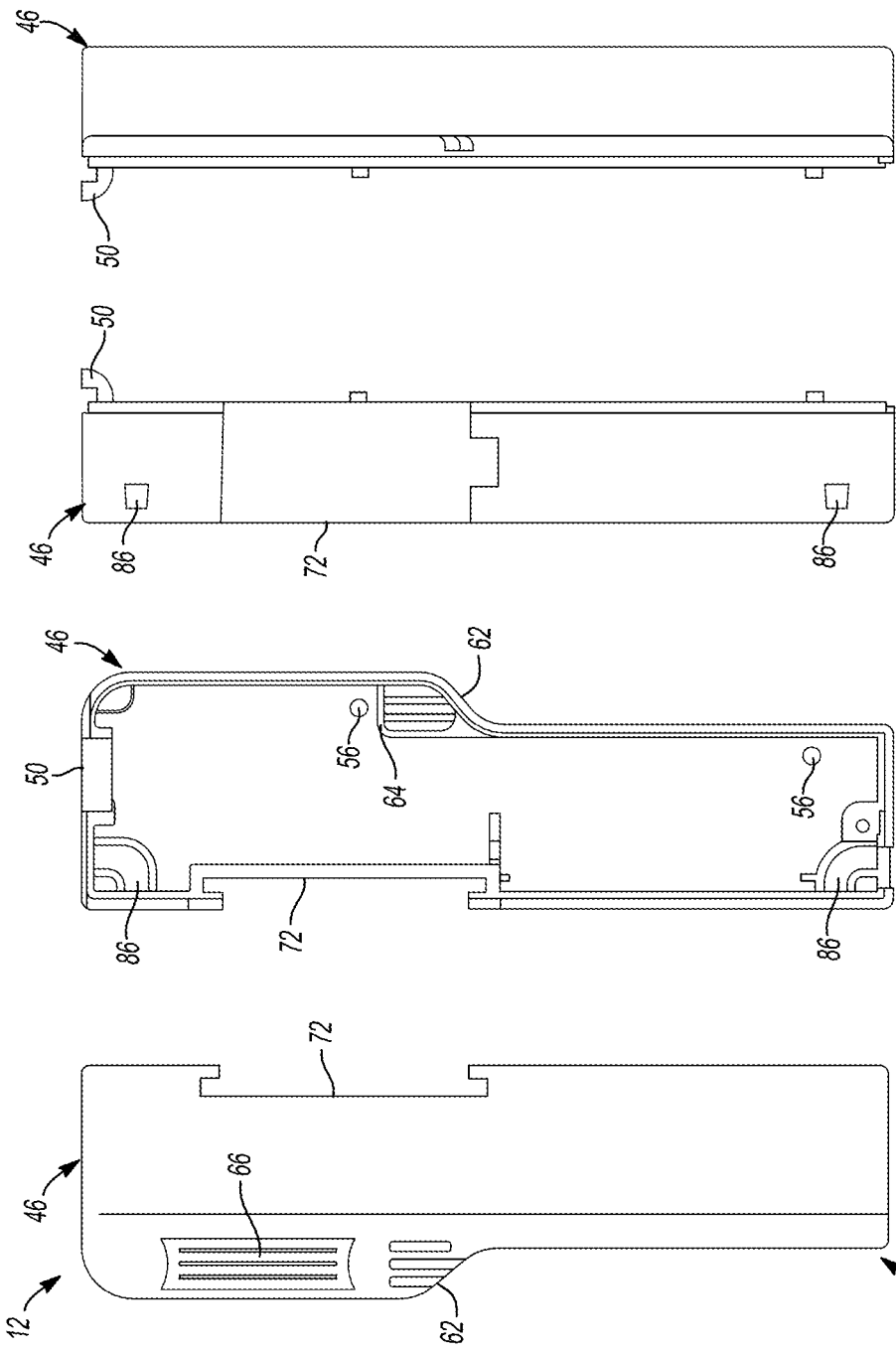

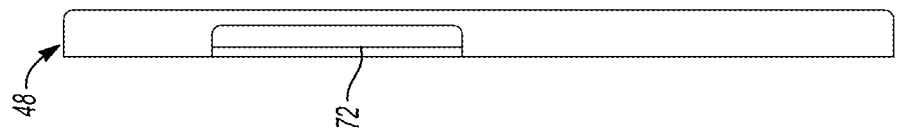
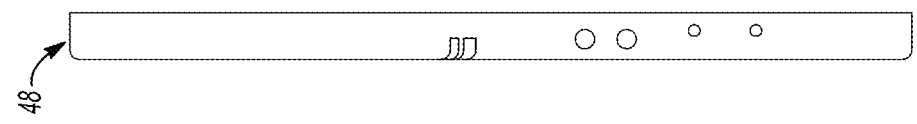
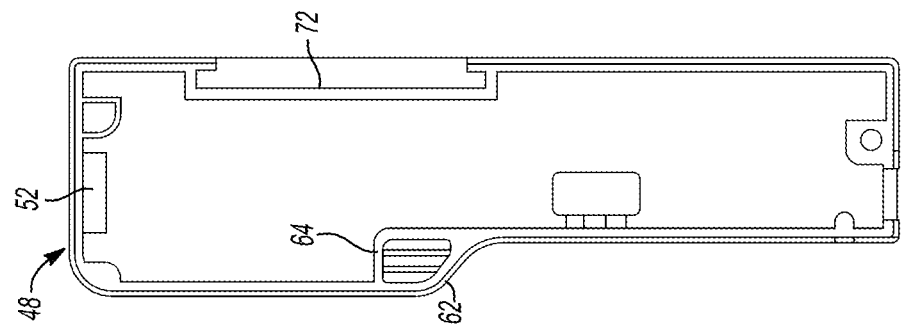
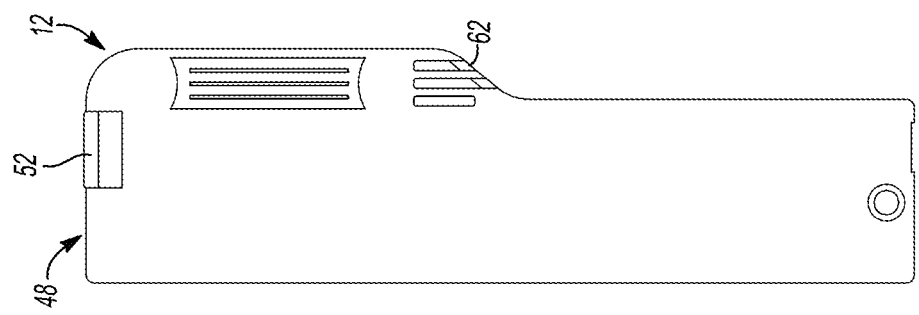

WIRELESS TEMPERATURE AND/OR HUMIDITY SENSOR ASSEMBLY

CROSS-REFERENCE TO RELATED APPLICATIONS

This application is a 371 National Phase application of PCT/US2013/066657, filed Oct. 24, 2013, which claims the benefit of U.S. Provisional Application No. 61/864,080, filed on Aug. 9, 2013. The entire disclosures of the above applications are incorporated herein by reference.

FIELD

The present disclosure relates to a wireless temperature and/or humidity sensor assembly having an enclosure or housing that optimizes the placement of the sensor element and the antenna, and includes an integral mounting feature.

BACKGROUND

This section provides background information related to the present disclosure which is not necessarily prior art.

Data centers and server rooms are facilities that house computer systems and their associated components, such as computer servers and data storage devices, data communication connections and equipment, backup power supplies, security devices, and environmental monitoring and control systems, like climate control systems and fire suppression systems, for example.

FIG. 1 illustrates an exemplary server room 300 that houses computer servers and related equipment. Typically, the computer servers are mounted in rack cabinets that are placed in single rows forming aisles between them to enable access to the front and rear of each cabinet. Servers can range in size and occupy many square feet of floor space.

Climate is significant factor that affects the energy consumption and environmental impact of a data center or server room. As such, the environment in the facility is closely monitoring and controlled. Wireless temperature sensors are used in data centers and server rooms to monitor ambient environmental conditions as part of an environmental monitoring and control system. Typically, the sensors are mounted to server racks in the data centers.

Referring to FIGS. 2A, 2B and 2C, one known wireless temperature sensor device 302 is shown. The temperature sensor 302 includes a main housing that can be mounted on the top or side of a computer server rack 304. In addition, a "sensor string," 306 including several discrete sensor elements 308, can also be included. When used, the sensor string 306 can be draped over the side of the computer server rack 304. Other know sensor devices can mount on a side or door of a computer server rack as shown in FIG. 2A. The constructions of currently known wireless temperature and/or humidity sensors' housings and/or enclosures, however, fail to optimally expose the sensor element to the ambient environment being monitored e.g., ambient air streams in and around the sensor). For example, the housings and/or enclosures of known sensors create "dead air" spaces in and around the sensor element and otherwise block entirely or poorly expose the sensor to the ambient air stream. These dead air spaces result in slow sensor response times and reduced sensitivity to the ambient environment being monitored Moreover, the known sensor constructions do not optimize the relative position of the sensor element and antenna to one another and to the mounting surface upon which the sensor is installed. In this regard, the antennas of known wireless temperature and/or humidity sensors exhibit polarization that is parallel to the ground plane created by the server rack mounting surface. As such, the antenna's effective efficiency, power and/or sensitivity can be negatively impacted.

In addition, conventional wireless temperature and/or humidity sensors provide inefficient mounting features and arrangements for locating and securing the sensors for use. For example, known sensor constructions employ slots or loops in the housing that facilitate attaching zip ties or similar mounting lanyards. These housing constructions generally increase the size or footprint of the sensor and can interfere in some installations.

Still further, known sensor constructions include housings having multiple threaded fasteners and/or snap-fit features that are difficult to assemble.

SUMMARY

This section provides a general summary of the disclosure, and is not a comprehensive disclosure of its full scope or all of its features.

A wireless sensor assembly for monitoring conditions in an ambient environment, such as for use in a climate control system for a data center, is disclosed. The sensor assembly has a small form-factor housing extending along a longitudinal axis. The housing defining an interior space in which is disposed a sensor system circuit including a sensor element for detecting at least one of temperature and humidity. A power source, such as a battery, in electrical communication with the sensor system circuit can also be disposed within the housing. A mounting member forming part of an exterior surface of the housing mounts the sensor assembly vertically along the longitudinal axis at an installation location within the ambient environment to be monitored.

In one aspect of the disclosure, the wireless sensor assembly is quickly and easily installed on a vertical frame element of a computer storage rack. In this regard, the sensor assembly extends lengthwise along a longitudinal axis from an upper end to a lower end, and a first side of the sensor assembly serves as a mounting side of the sensor assembly having a generally flat mounting surface. A second side of the sensor assembly opposite to the first side across the longitudinal axis is a sensor side of the sensor assembly. A mounting member forms part of the mounting surface of the sensor assembly. When the sensor assembly is mounted at the installation location, the sensor assembly extends vertically along the longitudinal axis with the mounting side engaging an installation surface of, for example, a computer storage rack, and the sensor side is exposed in an unobstructed manner to the ambient environment.

The sensor system circuit includes a printed circuit board that integrates one or more temperature and/or humidity sensor elements, a low power RF transceiver, an antenna, a power supply, and one or more I/O communications interfaces, such as, for example, a micro USB serial port, one or more LEDs, and a user interface. A small portion of the printed circuit board comprises a peninsula and the sensor element is mounted near an edge of the peninsula. The peninsula has a thermal mass that is less than the remainder of the printed circuit board. When the sensor assembly is mounted at an installation location, the printed circuit board of the sensor system circuit is oriented generally perpendicular to the installation surface.

The housing includes a top cover and a bottom cover that oppose one another to define an outer shell of the sensor assembly and enclose the interior space. The top cover includes an integrally formed hinge arm that fits into a corresponding slot in the bottom cover to join the top and bottom covers at one end. A fastener joins the top and bottom covers at an opposite end.

The housing forms a vented sub-chamber around the sensor element that enables ambient air to flow past and around the sensor element minimizing the amount of dead-air space around the sensor element. In combination with the low thermal mass of the printed circuit board, the sensitivity and responsiveness of the sensor element is enhanced.

The housing also includes raised ridge portions that provide a visual and tactile reference to a user mounting the sensor assembly at an installation location.

The housing includes a side wall forming a generally flat mounting surface that enables the sensor assembly to seat directly against a surface at an installation location. A slot is included in the side wall that receives a mounting member. The mounting member comprises an insert and has a magnet, a hook and loop fastener, or an adhesive, or the like.

The housing also incorporates a pair of channels each having a first opening in the side wall of the housing and a second opening in an adjacent wall. The channels, which can be located at both the upper and lower ends of the sensor assembly, can accommodate zip ties or the like which can be used to mount the sensor assembly.

In another aspect of the disclosure, the sensor assembly can further include a sensor string having at least one sensor element that is external to the housing.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 3A and 3B are left and right side perspective views, respectively, of the wireless sensor assembly of the present disclosure;

FIG. 4A is a front view of the wireless sensor assembly of the present disclosure;

FIG. 4B is a back view of the wireless sensor assembly of FIG. 4A;

FIG. 4C is a right side view of the wireless sensor assembly of FIG. 4A;

FIG. 5A is a front view of a sensor system circuit of the wireless sensor assembly of the present disclosure;

FIG. 5B is an enlarged detail view of a portion of the sensor system circuit of FIG. 5A showing a sensor element of the wireless sensor assembly of the present disclosure;

FIG. 5C is a front perspective view of the sensor system circuit of FIG. 5A;

FIG. 6A is a front view of the top cover of the wireless sensor assembly of the present disclosure;

FIG. 6B is a back view of the top cover of FIG. 6A;

FIG. 6C is a right side view the top cover of FIG. 6A;

FIG. 6D is a left side view of the top cover of FIG. 6A;

FIG. 7A is a front view the bottom cover of the wireless sensor assembly of the present disclosure;

FIG. 7B is a back view the bottom cover of FIG. 7A;

FIG. 7C is a right side view the bottom cover of FIG. 7A;

FIG. 7D is a left side view the bottom cover of FIG. 7A;

Corresponding reference numerals indicate corresponding parts throughout the several views of the drawings.

DETAILED DESCRIPTION

Example embodiments will now be described more fully with reference to the accompanying drawings. The example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Figure 1:
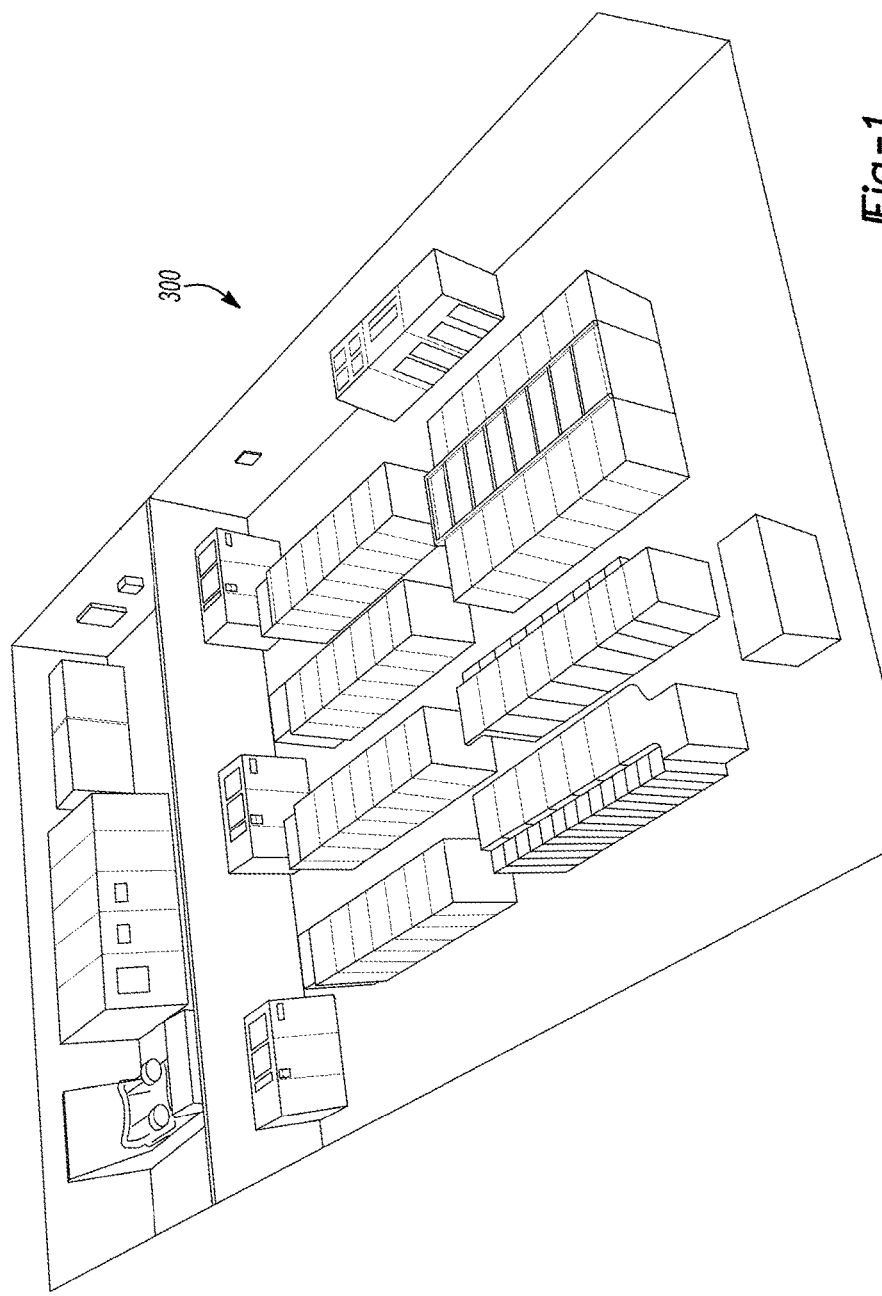
FIG. 1 shows an exemplary data center server room in which the wireless sensor of the present disclosure may be utilized.
Figure 2C:
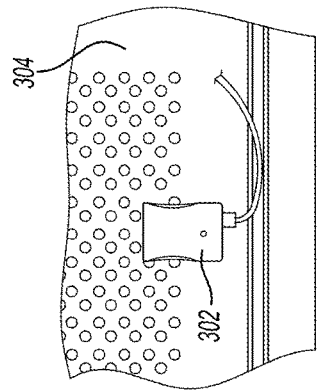
FIGS. 2A, 2B and 2C show conventional wireless sensors as installed on a server rack in a data center server room.
Figure 2B:
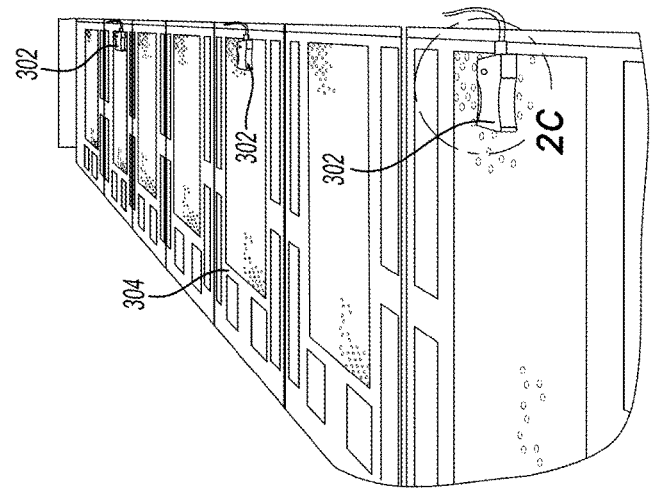
Figure 2A:
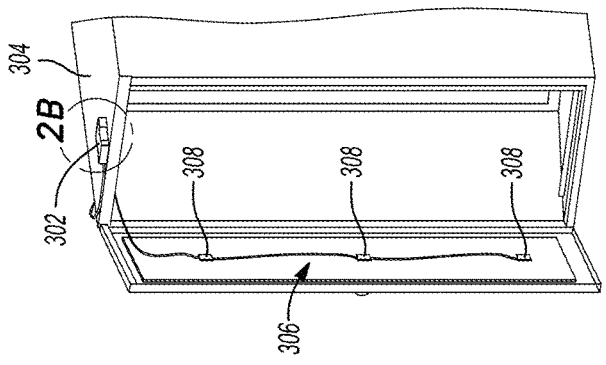
Figure 8:
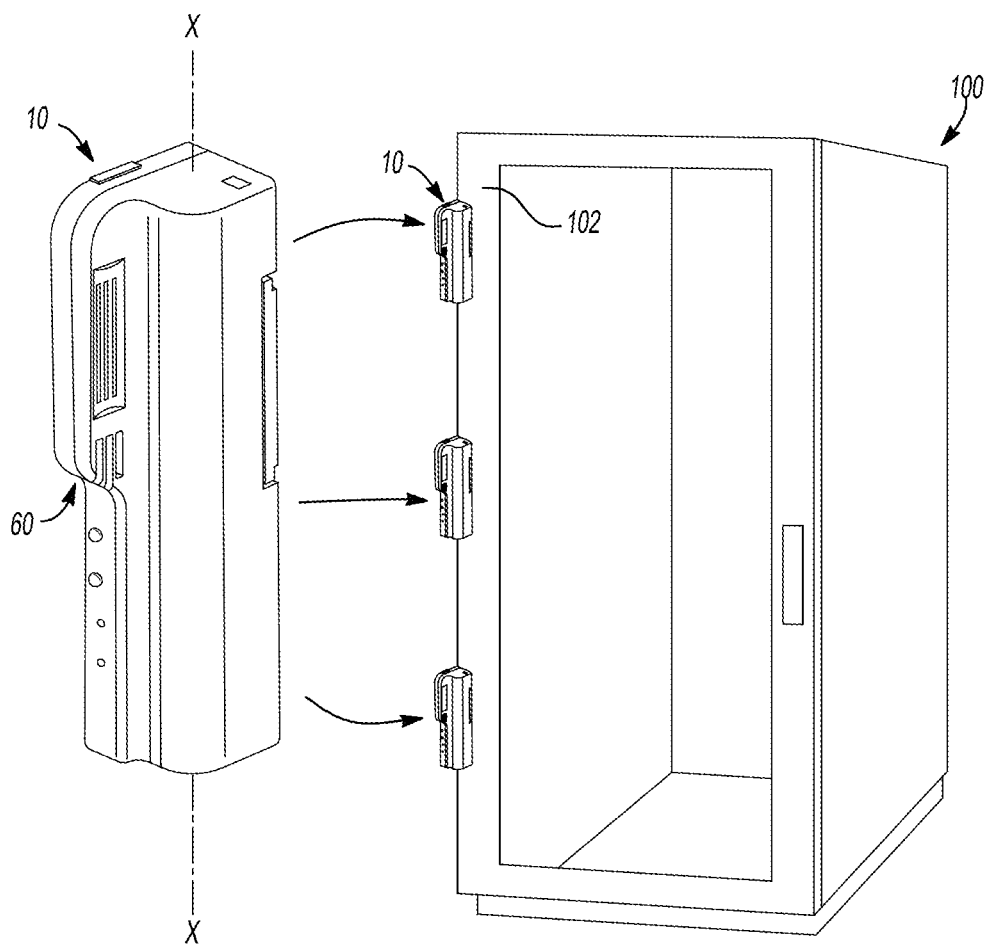
FIG. 8 shows the wireless sensor assembly of the present disclosure as mounted on a computer storage rack.

The wireless temperature and/or humidity sensor assembly 10 of the present disclosure can be utilized as part of a climate control system for a data center or server room. The sensor assembly 10 has a small form-factor and can be easily and quickly installed on a computer storage rack 100, as best illustrated in FIG. 8.

With reference to the Figures, the wireless temperature and/or humidity sensor assembly 10 of the present disclosure can be understood with reference to FIGS. 3-9. FIGS. 3A and 3B show a right-front perspective view and a left-front perspective view, respectively, of the sensor assembly 10 and FIGS. 4A, 4B, and 4C show front, back and right side views, respectively, of the sensor assembly 10. The sensor assembly 10 extends lengthwise along a longitudinal axis X from an upper end 12 to a lower end 14. One side of the sensor assembly 10 can generally be understood as a mounting side 16 comprising a generally flat mounting surface 18 and another side of the sensor assembly opposite to the mounting side 16 can generally be understood as the sensor side 20. When installed, the sensor assembly 10 extends vertically along the longitudinal axis X with the mounting side 16 engaging an installation surface of a computer storage rack 100, or the like and the sensor side 20 being exposed unobstructed to the ambient environment.

The sensor assembly 10 generally includes a housing 22 enclosing a sensor system circuit 24 and a sensor mounting member 26. Batteries 28, such as standard AA or AAA size (best seen in FIG. 5C), enclosed within the housing 22, or an external power source (not shown), can provide power to the sensor assembly 10.

Referring to FIG. 5A, the sensor system circuit 24 is illustrated. The sensor system circuit 24 can provide the sensing and communication functions of the wireless temperature and/or humidity sensor assembly 10 of the present disclosure. As shown in FIG. 5A, the sensor system circuit 24 can be disposed on a printed circuit board (PCB) substrate 30 and can integrate one or more temperature and/or humidity sensor element(s) 32, a low power RF transceiver 34, an antenna 36, a power supply 38, and one or more I/O communications interfaces 40, 42, 44.

Suitable sensor elements 32 for use in the sensor assembly 10 of the present disclosure are known in the art, such as the SHT-21 digital temperature and humidity sensor available from Sensirion AG, or the TMP112 temperature sensor available from Texas Instruments Incorporated. As shown in the enlarged detail of FIG. 5B, the sensor element 32 can be mounted near the edge 46 of the PCB 30 and on a small projection portion 48 of the board 30 that projects from the remainder of the board like a peninsula. The small projection portion 48 of the printed circuit board 30 has a very low thermal mass. The low thermal mass of the projection portion 48 of the printed circuit board 30 enables the sensor element 32 to be more sensitive to temperature and/or humidity fluctuations and, consequently, the response time of the sensor element 32 and sensor assembly 10 can be beneficially shortened.

Although the exemplary embodiment of the disclosure described herein employs a temperature and humidity sensor, it can be appreciated that sensors for monitoring any of a variety of ambient environmental conditions in addition to temperature and humidity can be included, such as sensor for monitoring pressure, carbon monoxide level, carbon dioxide level, and air corrosivity, among others.

The RF transceiver 34 can be IEEE 802.15.4 compliant and can operate according to WirelessHART, ZigBee, and/or other similar protocols. Suitable low power RF transceivers that can be used in the sensor assembly are known in the art, such as the LTC5800 series Mote-on-Chip, available from Linear Technologies Inc. A suitable antenna 36 for the sensor assembly 10 is well-known in the art. The antenna 36 can be located in the sensor system circuit 24 at an end opposite from a I/O communication interface 40. Consequently, when the sensor assembly 10 is installed for use, the antenna 36 is at the upper end of the sensor assembly 10.

The sensor system circuit 24 can include one or more I/O communications interfaces 40, 42, 44, including, for example, a micro USB serial port 40 and/or one or more push-buttons 42 (as seen in FIGS. 3A, 4A and 4B) that provide a direct user interface to the sensor system circuit 24. The communication interfaces 40, 42 can be used to connect the sensor assembly 10 with another device, such as a computer, smartphone, or the like, and/or to communicate with the sensor assembly 10 for purposes of configuration, calibration, diagnostics, and/or other programming functions. LEDs 44 in the sensor system circuit can extend though the housing (as seen in FIG. 3A) and can provide visual indicators communicating a condition or status of the sensor assembly 10 to users and/or other electronic devices.

The power supply 38 can deliver power the sensor system circuit 24 from a battery power source 28 (as shown in FIG. 5C) contained within the sensor assembly 10 or from an external power source (not shown).

With reference to FIGS. 6A-6D and 7A-7D, components of the housing 22 of the sensor assembly 10 are shown greater detail. The housing 22 can include a first, top cover 46 (shown in FIGS. 6A-6D) and a second, bottom cover 48 (shown in FIGS. 7A-7D). FIG. 6A is a front view of the top cover 46 showing the exterior of the top cover 46 and FIG. 6B is a back view showing the interior of the top cover 46. Similarly, FIGS. 7A and 7B are, respectively, front and back views of the bottom cover 48 showing the exterior and interior of the bottom cover 48. The housing 22 components can be molded from plastic. The top and bottom covers 46, 48 come together in a clam shell-type arrangement, opposing one another to define an outer shell of the sensor assembly and enclose an interior space of the sensor assembly. The PCB 30 for the sensor system circuit 24 is disposed within the interior space of the housing 22.

Referring to FIGS. 6B-6D, the top cover 46 can include an integrally formed hinge arm 50 at the upper end 12. A corresponding slot 52 in the upper end 12 of the bottom cover 48, as shown in FIGS. 7A-7B, can receive the hinge arm 50 of the top cover 46 to connect the top and bottom covers 46, 48 at the upper end 12. A single fastening device 54, such as the threaded fastener shown in FIG. 4B, for example, can then be used at the lower end 14 of the housing 22 to connect the top and bottom covers 46, 48 together. The fastener can be made of metal or plastic. Of course, fastening means well-known in the art other than a threaded fastener, such as snap-fit-type connectors, and the like, can be used. The hinge 50, 52 and single fastener 54 can simplify the construction of the sensor assembly 10 and help minimize the potential for RF interference caused by numerous metallic screws as with prior art sensors.

As seen in FIG. 6B, the top cover 46 can provide mounting bosses 56 to locate the PCB 30 for the sensor system circuit 24. The PCB 30 can be affixed to the top cover 46, such as by threaded fasteners (not shown) which pass through apertures 58 in the PCB 30 and are received in the mounting bosses 56. Of course, the PCB 30 can alternatively be affixed to the bottom cover 48 and/or be affixed by means well-known in the art other than threaded fasteners, such as snap-fit-type connectors and the like.

Referring additionally to FIGS. 3A, 3B, 4A and 4B, when the top and bottom 46, 48 covers are joined, the housing 22 forms a vented sub-chamber 60 around the sensor element 32. As seen in FIGS. 6A, 6B, 7A and 7B, each of the top and bottom 46, 48 covers includes a vent opening 62 that is surrounded by an annular wall 64. The vent openings 62 enable ambient air to flow past and around the sensor element 32 when the sensor assembly 10 is installed for use. Moreover, the sub-chamber 60 formed by the housing 22 around the location of the sensor element 32 minimizes the amount of dead-air space around the sensor element 32, thereby enhancing the sensitivity and responsiveness of the sensor element 32 and sensor assembly 10.

As shown in the FIGS. 3A, 3B, 4A, 4B, 6A and 7A, the top and bottom covers 46, 48 of the housing 22 each include longitudinally extending raised ridge portions 66 in its outer surface 68. The ridge portions 66 create a raised surface on the outer shell of the housing 22 that can be employed by a user to grip the sensor assembly 10 housing and provide tangible visual and tactile references to aid the user in positioning and placement of the sensor assembly 10 at an installation location in the monitored environment.

As best seen in FIGS. 3B and 4C, the housing 22 includes a side wall 70 forming a mounting surface 18 for the sensor assembly 10. The mounting surface 18 is a generally flat surface that enables the sensor assembly 10 to seat against a corresponding flat surface of a computer storage rack 100 (e.g., on a door or frame), or the like, when installed.

As understood with reference to FIGS. 6A, 6B and 7B, the top and bottom covers 46, 48 of the housing 22 each include a cut-out portion 72. When the top and bottom covers 46, 48 are joined, the cut-out portions 72 form a slot 74 in the side wall 70 of the outer shell. As shown in FIGS. 3B, 4A and 4C, the mounting member 26 occupies the slot 74 and is generally flush with mounting surface 18 of the side wall. In this regard, the mounting member 26 can comprise an insert that can be fixedly or removably received in the slot 74 formed in the housing 22, such as with a tapered fit or a snap fit, for example. As shown in FIGS. 3B, 4C, 10, 11 and 12, the mounting member 26 can include a mounting bracket 78 (FIG. 10), one or more magnet(s) 80 (FIG. 3B), a hook and loop fastener (e.g., Velcro®) 82 (FIG. 11), and/or an adhesive 84 (FIG. 12), or the like. Consequently, the mounting member 26 can readily be configured to suit any of a variety of installation conditions in order to secure the sensor assembly 10 at an installation location in the monitored environment. The mounting member 26 enables the sensor assembly 10 to be quickly and easily installed on a door or frame of a computer rack 100.

Figure 12:
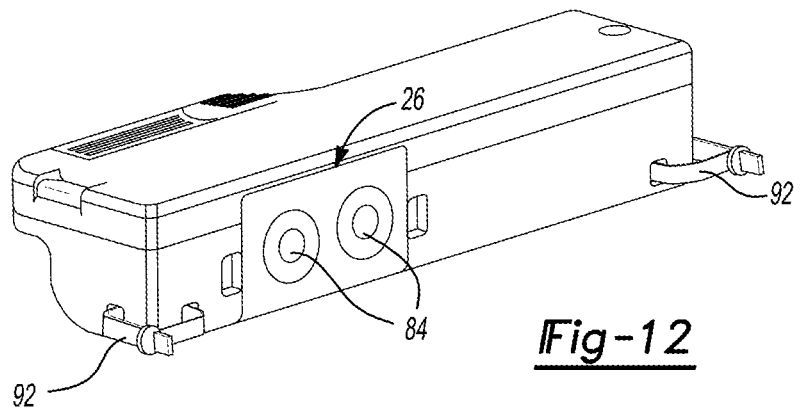

Referring to FIGS. 3A, 3B, 4C, 6B, 6C, and 12, the housing 22 also incorporates a pair of curved channels 86 passing through the housing 22, each channel 86 having a first opening in the side wall of the housing 22 forming the mounting surface 18 and a second opening in an adjacent wall of the housing 22. The channels 86 pass through the housing 22 and do not upset the profile of the generally flat mounting surface 18. The channels 86 can be located generally at the upper 12 and lower ends 14 of the sensor assembly 10. The channels 86 can accommodate a supplemental mounting device 92 for installing the sensor assembly 10, such as a cable tie or "zip-tie," for example, as seen in FIG. 12. Consequently, external zip-tie mounting loops that are prevalent in prior art sensors can be eliminated.

FIG. 8 shows the sensor assembly 10 installed on a frame of a computer rack 100. In an installed position, the sensor assembly 10 can be mounted vertically along the longitudinal axis X. The mounting member 26 affixes the sensor assembly 10 to the computer rack 100 such that the mounting surface 18 of the sensor assembly 10 is placed against a corresponding installation surface 102 of the computer rack 100 and the sensor side 20 of the sensor assembly 10, including the vented sub-chamber 60 encompassing the sensor element 32, is offset from the installation surface 102 of the computer rack 100 with unrestricted exposure to the ambient environment.

In the installed configuration, then, the PCB 30 of the sensor system circuit 24 can be oriented generally perpendicular (i.e., edgewise) to the installation surface 102 of the computer rack 100. This edgewise installation orientation minimizes the impact of mounting surface effects on the sensor system circuit 24 components and presents minimal, if any, obstruction to the air flow to the computer rack 100. Further, the edgewise installation orientation provides optimal visibility and access to the LEDs 44 and communications interfaces 40, 42. Still further, the installation orientation of the sensor system circuit 24 relative to the installation surface 102 of the computer rack 100 is perpendicular. As such, the antenna 36 is rotated 90° with respect to installation surface 102 of the computer rack 100, which operates as a ground plane for the antenna 36. With the antenna 36 at a right angle to the computer rack mounting surface 102 the antenna 36 exhibits an optimized radiation pattern, propagating the signal out and away from the computer rack ground plane surface with greater energy.

Figure 9:
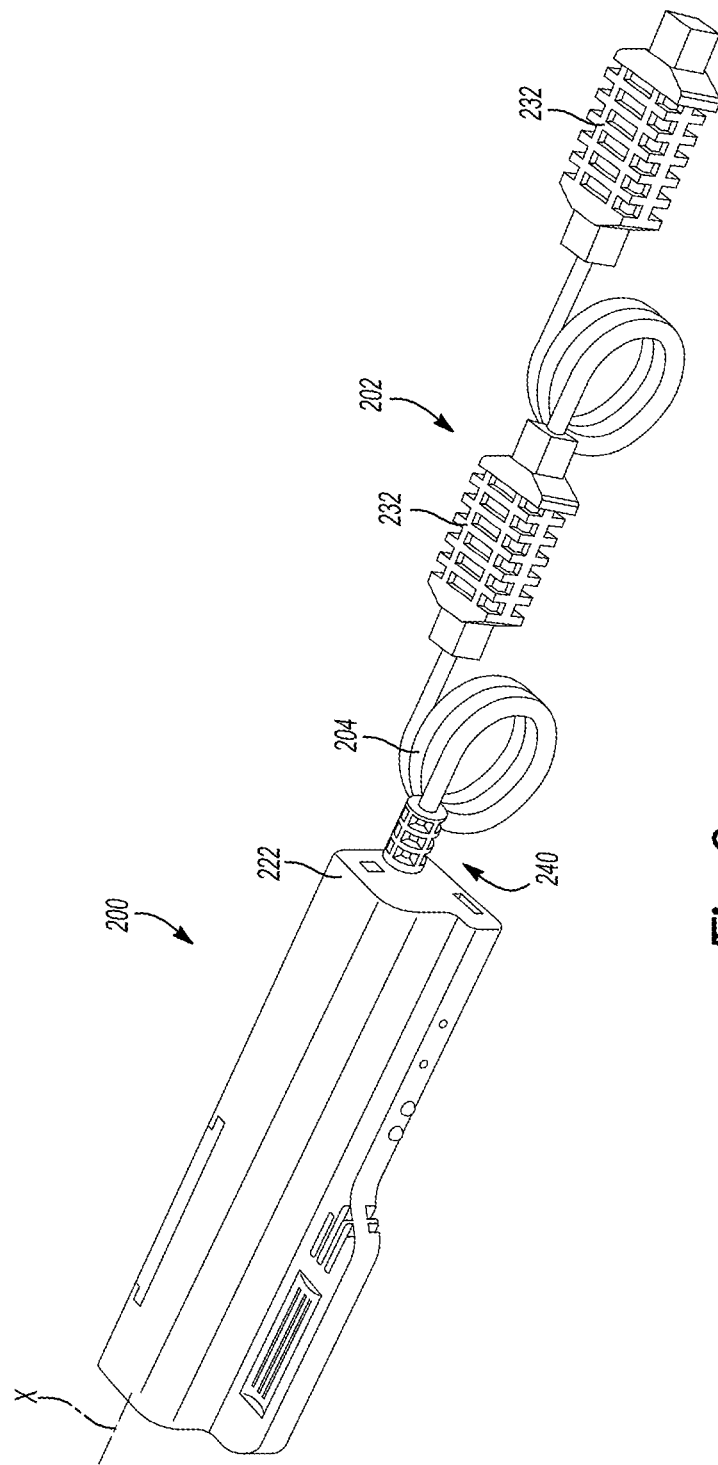
FIG. 9 is a perspective view of an alternative embodiment of the wireless sensor assembly of the present disclosure that includes an auxiliary sensor string.
Figure 10:
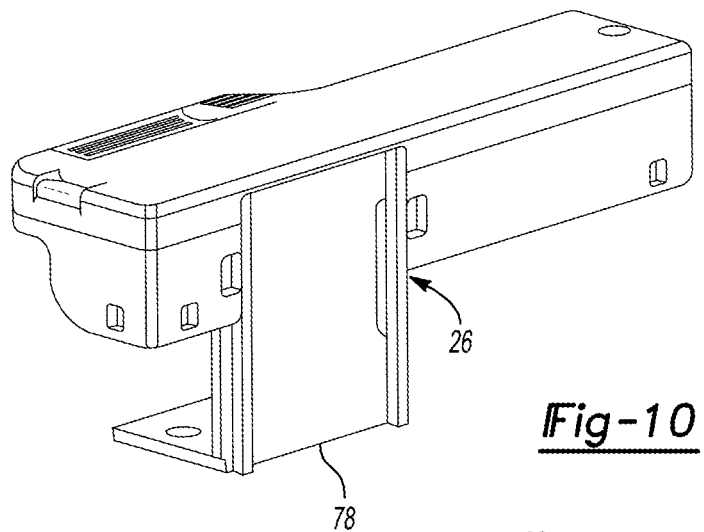
FIGS. 10, 11, and 12 show a wireless sensor assembly having various alternative mounting arrangements.
Figure 11:
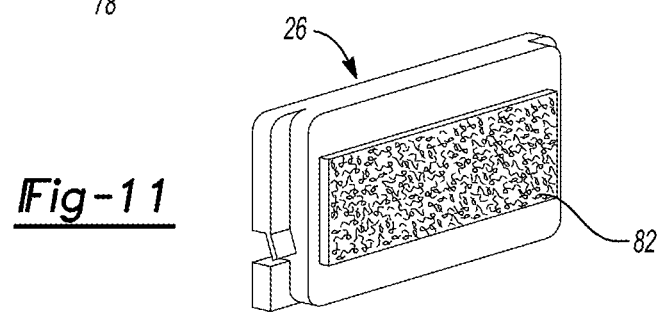

FIG. 9 shows an alternative embodiment of a wireless sensor assembly 200 according to the present disclosure. The sensor assembly 200 includes a sensor string 202 that can have one or more (e.g., two, three or four) additional sensor elements 232 external to the housing 222. The sensor string 202 is connected to a communications port 240 integrated the sensor system circuit 24 that is located along the longitudinal axis X of the sensor assembly 200. As shown in FIG. 9, the sensor string 202 can include two external sensor elements 232. The external sensor elements 232 can be connected to the communications port 240 by a communications cable 204 (e.g., a serial cable). When the sensor assembly 200 is installed on a computer rack 100, for example, the cable 204 unwinds and the external sensor elements 232 are suspended by gravity from the housing 222 of the sensor assembly 200 by the cable 204 such that each of the two external sensor elements 232 are positioned at fixed distances beneath the housing 222. In this manner, it can be appreciated that the ambient conditions at several different locations in the environment can be monitored by the sensor assembly 200.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A wireless sensor assembly for use in a climate control system for an ambient environment comprising:

a housing extending along a first longitudinal axis and having a mounting side and a sensing side opposite of the longitudinal axis to the mounting side, the mounting side comprising a planar mounting surface and a mounting member operable to orient the sensor assembly vertically along the first longitudinal axis and position the sensor assembly at an installation location within the ambient environment, wherein the mounting member is disposed in the housing and is generally co-planar with the mounting surface of the housing, wherein the mounting side of the housing comprises a slot in the mounting surface; and wherein the mounting member comprises an insert received in the slot;

wherein the housing comprises a first cover and a second cover, the first cover comprising a vent opening and a coupling portion, the second cover comprising a vent opening and a receiving portion configured to receive the coupling portion, the first cover being opposed to the second cover to define an interior space comprising a vented sub-chamber when the receiving portion receives the coupling portion;

a printed circuit board (PCB) mounted to the housing within the interior space and comprising a planar first portion located adjacent to the sensing side of the housing and comprising a peninsula extending along a second longitudinal axis that is perpendicular to the first longitudinal axis, and a planar second portion located adjacent to both the mounting side of the housing and the first portion of the PCB, the planar first portion having a thermal mass that is less than a thermal mass of the planar second portion;

wherein the first portion of the PCB is located within the vented sub-chamber of the interior space and the second portion of the PCB is located in a remainder of the interior space, the first portion of the PCB projecting transversely away from the second portion of the PCB;

a sensor system circuit and a power source in electrical communication with the sensor system circuit being disposed on the PCB, the sensor system circuit comprising a sensor element for detecting a condition of the ambient environment and an antenna, the sensor element being mounted on the first portion of the PCB and the antenna being mounted on second portion of the PCB and oriented perpendicular to the mounting surface of the housing, wherein the mounting location operates as a ground plane for the antenna.

2. The wireless sensor assembly of claim 1 wherein the condition of the ambient environment comprises at least one of temperature, humidity, pressure, carbon monoxide level, carbon dioxide level, and air corrosivity.

3. The wireless sensor assembly of claim 2, wherein the insert comprises one a magnet, a hook and loop fastener, and an adhesive.

4. The wireless sensor assembly of claim 3, wherein the housing comprises raised ridge portions at the sensor side for providing a user with a tactile reference when mounting the sensor assembly at an installation location.

5. The wireless sensor assembly of claim 2, wherein the housing further comprises at least one channel passing through the housing, the channel having a first opening in the mounting side of the housing and a second opening in a wall of the housing that is adjacent to the mounting side; and
wherein a second mounting member passes through the channel to secure the sensor assembly at the installation location.

6. The wireless sensor assembly of claim 5, wherein the second mounting member comprises a strap.

7. The wireless sensor assembly of claim 6, wherein the housing comprises first and second channels, each channel having a first opening in the mounting side of the housing and a second opening in a wall of the housing that is adjacent to the mounting side;
wherein the first channel is are located at upper vertical end of the housing and the second channel is located at a lower vertical end of the housing; and
wherein two second mounting members pass, respectively, through each of the first and second channels to secure the sensor assembly at the installation location.

8. The wireless sensor assembly of claim 7, wherein the first cover includes an integrally formed hinge arm at an upper vertical end of the first cover and the second cover includes a corresponding slot at the upper vertical end of the second cover;
wherein the hinge arm is received in the slot to join the first and second covers at their respective upper vertical ends; and
wherein the first and second covers are joined by a fastener at respective lower vertical ends thereof.

9. The wireless sensor assembly of claim 2, wherein the sensor system circuit further comprises a communication port; and
the sensor assembly further comprises a sensor string having at least one second sensor element located external to the housing, the sensor string comprising a communication cable in communication with the communication port;
wherein the at least one second sensor element is supported at a location vertically below the housing by the mounting member.

10. A wireless sensor assembly for use in a climate control system for an ambient environment comprising:
a housing extending along a first longitudinal axis and having a mounting side and a sensing side opposite of the longitudinal axis to the mounting side, the mounting side comprising a planar mounting surface and a mounting member operable to orient the sensor assembly vertically along the first longitudinal axis and position the sensor assembly at an installation location within the ambient environment;
wherein the housing comprises a first cover and a second cover, the first cover comprising a vent opening and a coupling portion, the second cover comprising a vent opening and a receiving portion configured to receive the coupling portion, the first cover being opposed to the second cover to define an interior space comprising a vented sub-chamber when the receiving portion receives the coupling portion;
wherein the housing further comprises at least one channel passing through the housing, the channel having a first opening in the mounting side of the housing and a second opening in a wall of the housing that is adjacent to the mounting side;
wherein the mounting member passes through the channel to secure the sensor assembly at the installation location;
a printed circuit board (PCB) mounted to the housing within the interior space and comprising a planar first portion located adjacent to the sensing side of the housing and comprising a peninsula extending along a second longitudinal axis that is perpendicular to the first longitudinal axis, and a planar second portion located adjacent to both the mounting side of the housing and the first portion of the PCB, the planar first portion having a thermal mass that is less than a thermal mass of the planar second portion;
wherein the first portion of the PCB is located within the vented sub-chamber of the interior space and the second portion of the PCB is located in a remainder of the interior space, the first portion of the PCB projecting transversely away from the second portion of the PCB;
a sensor system circuit and a power source in electrical communication with the sensor system circuit being disposed on the PCB, the sensor system circuit comprising a sensor element for detecting a condition of the ambient environment and an antenna, the sensor element being mounted on the first portion of the PCB and the antenna being mounted on second portion of the PCB and oriented perpendicular to the mounting surface of the housing, wherein the mounting location operates as a ground plane for the antenna.

11. The wireless sensor assembly of claim 10, wherein the second mounting member comprises a strap.

12. The wireless sensor assembly of claim 11, wherein the housing comprises first and second channels, each channel having a first opening in the mounting side of the housing and a second opening in a wall of the housing that is adjacent to the mounting side;
wherein the first channel is are located at upper vertical end of the housing and the second channel is located at a lower vertical end of the housing; and
wherein two second mounting members pass, respectively, through each of the first and second channels to secure the sensor assembly at the installation location.

13. The wireless sensor assembly of claim 10, wherein the sensor system circuit further comprises a communication port; and
the sensor assembly further comprises a sensor string having at least one second sensor element located external to the housing, the sensor string comprising a communication cable in communication with the communication port;
wherein the at least one second sensor element is supported at a location vertically below the housing by the mounting member.

* * * * *